(12) United States Patent
Griffin

(10) Patent No.: US 6,498,539 B2
(45) Date of Patent: Dec. 24, 2002

(54) HIGHLY ACCURATE VOLTAGE CONTROLLED OSCILLATOR WITH RC CIRCUIT

(75) Inventor: Jed D. Griffin, Forest Grove, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/750,132

(22) Filed: Dec. 29, 2000

(65) Prior Publication Data

US 2002/0084861 A1 Jul. 4, 2002

(51) Int. Cl.[7] .............................................. H03K 3/00
(52) U.S. Cl. ..................... 331/143; 331/177 R; 331/111
(58) Field of Search ................................ 331/111, 143, 331/177 R

(56) References Cited

U.S. PATENT DOCUMENTS 5,430,414 A * 7/1995 Sempel et al. .............. 331/111
5,670,915 A * 9/1997 Cooper et al. .............. 331/111

* cited by examiner

Primary Examiner—Arnold Kinkead
(74) Attorney, Agent, or Firm—Kenyon & Kenyon

(57) ABSTRACT

A VCO includes a non-inverting output and an inverting output coupled to symmetrical circuitry configured to produce an oscillating output at the outputs. The symmetrical circuitry can include, for example, matched devices such as voltage-controlled resistors (VCRs) and capacitors. The symmetrical circuitry coupled to the non-inverting output and inverting output results in a stable output that operates close to the optimal 50% duty cycle independent of frequency and across a wide range of frequencies. In an alternative embodiment, the VCO further includes an output differential amplifier having its non-inverting input coupled to the non-inverting output and its inverting input coupled to the inverting output. The VCO according to this embodiment exhibits higher gain and a stable output that operates close to the optimal 50% duty cycle independent of frequency and across a wide range of frequencies.

28 Claims, 6 Drawing Sheets

HIGHLY ACCURATE VOLTAGE CONTROLLED OSCILLATOR WITH RC CIRCUIT

FIELD OF THE INVENTION

Embodiments of the present invention relate to voltage controlled oscillators. In particular, the present invention relates to a highly accurate voltage controlled oscillator that exhibits optimal performance across a wide range of frequencies.

BACKGROUND

Voltage Controlled Oscillators (VCOs) are per se known. VCOs generate an oscillating signal at their output that varies in frequency according to the level of voltage input. VCOs are widely applied in high speed clocking applications such as clocking circuits and within phase locked loops (PLLs).

Conventional VCOs offer performance at less than an optimal duty-cycle of 50% across a wide range of frequencies. As frequency increases, the duty-cycle of traditional VCOs approaches 100% causing traditional VCOs to fail prematurely. Thus, traditional VCOs suffer from limited use at the higher frequency ends and utilize power inefficiently.

To maintain an optimal duty cycle, traditional VCOs are required to operate at twice the desired output frequency. An output at 50% duty cycle can then be obtained by halving the frequency of the poor duty cycle output from traditional VCOs. This technique is disadvantageous in that running the VCO at twice the required output frequency significantly increases the power consumed and halves an unstable maximum operating frequency. At higher frequencies, traditional VCOs become unstable due to the inherent non-symmetry in their design.

There is a need for a VCO that oscillates at or near the optimal duty-cycle of 50% across a wide range of frequencies. There is also a need for a VCO that is more accurate and stable at higher frequencies, and that offers reduced power consumption.

DETAILED DESCRIPTION

Embodiments of the present invention relate to a voltage controlled oscillator (VCO) that operates at optimal levels independent of frequency and across a wide range of frequencies. In one embodiment, the VCO includes an output differential amplifier having symmetrical circuitry coupled to and/or between each non-inverting input and inverting input. The symmetrical circuitry can include matched devices such as voltage-controlled resistors (VCRs) and capacitors. The symmetrical circuitry between the non-inverting input and inverting input results in a stable output that operates close to the optimal 50% duty cycle independent of frequency and across a wide range of frequencies. Unlike traditional VCOs, the VCO of the present invention does not require operation at twice the desired frequency to maintain optimal performance. Thus, the amount of power that is consumed is reduced.

Figure 1:
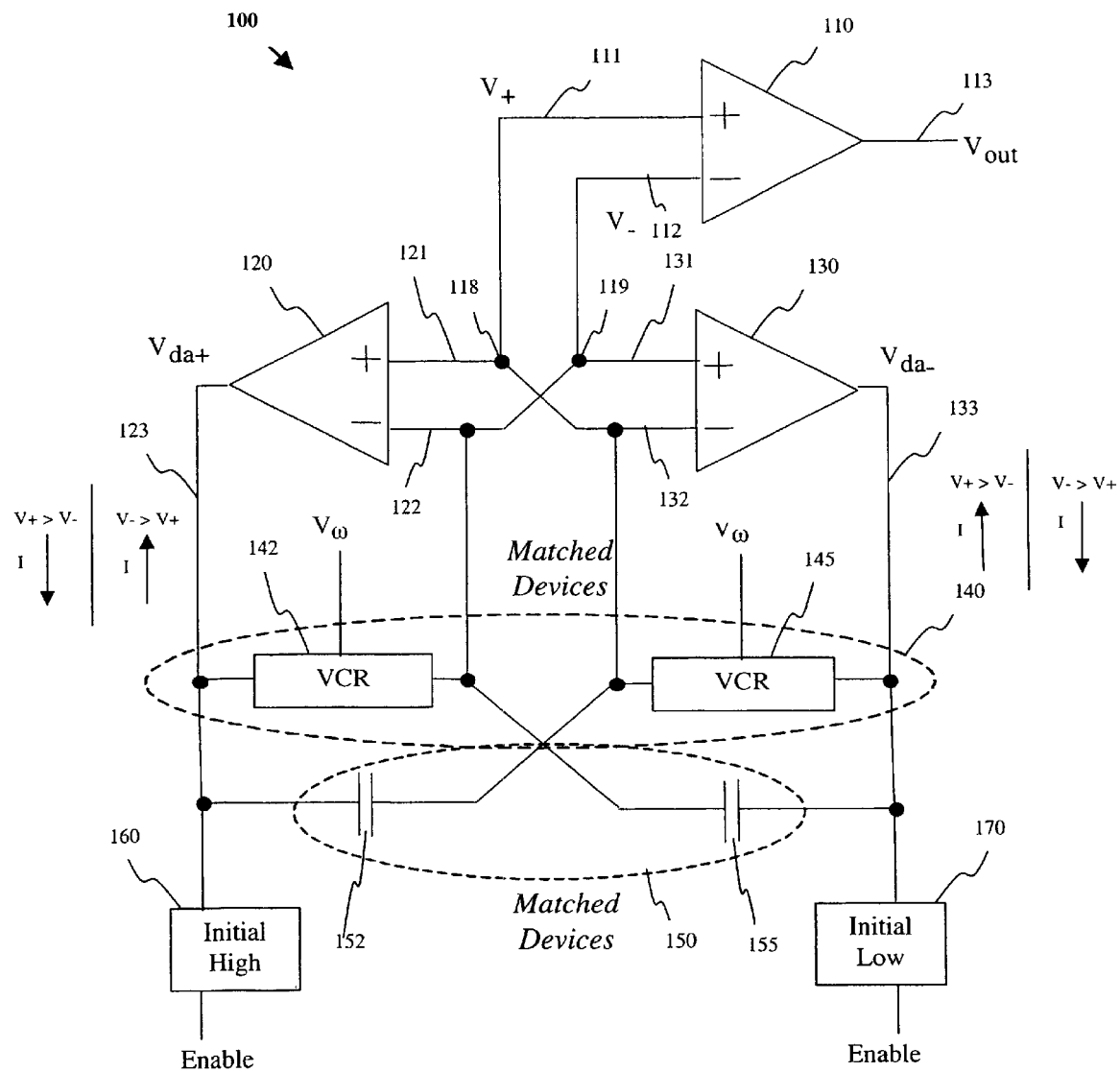
FIG. 1 is a circuit diagram of a VCO according to an embodiment of the present invention.

FIG. 1 shows a circuit diagram of a highly accurate VCO 100 according to an embodiment of the present invention. VCO 100 includes a plurality of differential amplifiers (110, 120 and 130), matched devices (140 and 150) and initialization switches (160 and 170). Differential amplifier 110 has an output $V_{out}$ 113 and inputs $V_+$ (i.e., non-inverting input 111) and V− (i.e., inverting input 112). According to embodiments of the present invention, the inputs of amplifier 110 are coupled to symmetrical circuitry that promotes the generation of an optimal and stable oscillating output $V_{out}$. As shown in FIG. 1, the symmetrical circuitry includes differential amplifiers 120, 130 and matched devices 140 and 150.

In an embodiment of the present invention, two circuits can be symmetrical to each other if each contains the same or similar components having the same values and configured in the same manner. This type of symmetry is referred to herein as component level symmetry. It is recognized that in some cases two circuits may be symmetrical to each other if the RC time constant is the same for both circuits.

Differential amplifier 120 has its non-inverting input 121 coupled to the non-inverting input 111 of differential amplifier 110. Differential amplifier 120 has its inverting input 122 coupled to the inverting input 112 of differential amplifier 110. Differential amplifier 120 has an output 123 $V_{da+}$. Differential amplifier 130 has its non-inverting input 131 coupled to the inverting input 112 of differential amplifier 110. Differential amplifier 130 has its inverting input 132 coupled to the non-inverting input 111 of differential amplifier 110. Differential amplifier 130 has an output 133 $V_{da-}$. Additionally, the inverting input 122 of differential amplifier 120 is also coupled to the non-inverting input 131 of differential amplifier 130, and the non-inverting input 121 of differential amplifier 120 is also coupled to the inverting input 132 of differential amplifier 130. Differential amplifiers are used to amplify differential inputs, usually small signal differentials, at any given common mode of operation. Superior performance can be achieved by the differential amplifier which exhibits higher amplification that remains consistent and constant across a wide common mode range.

In embodiments of the present invention, VCO 100 utilizes differential amplifiers because differential amplifiers offer high-speed operations with lower gains. However, it is recognized that where higher gain is desired, operational amplifiers that operate at lower speeds can be used in lieu of differential amplifiers.

The symmetrical circuitry coupled to the inputs 111 and 112 of amplifier 110 further includes matched devices 140. Matched devices 140 can be variable resistors such as voltage controlled resistors (VCR) 142, 145 having a resistance R. The resistance R of a VCR varies as the value of an input voltage varies. Accordingly, any suitable circuitry that varies the resistance R in response to an input voltage may be used. In embodiments of the present invention, analog or digital inputs can be used to control the VCRs. VCRs 142, 145 may be simple VCRs, improved linearity VCRs or any other suitable types of VCRs. VCRs 142 and 145 may be programmable resistors that include any type of known designs. In embodiments of the present invention, VCRs can include active resistors that can be configured using known designs.

VCR 142 is coupled between output 123 and inverting input 122 of amplifier 120. VCR 145 is coupled between output 133 and inverting input 132 of amplifier 130. VCRs 142 and 145 provide feedback for amplifiers 120 and 130. VCR 142 is also commonly coupled to the non-inverting input 131 and inverting input 112 of amplifiers 130 and 110, respectively. VCR 145 is also commonly coupled to the non-inverting input 121 and non-inverting input 111 of amplifiers 120 and 110, respectively. In embodiments of the present invention, VCRs 142, 145 are controlled by common input voltage V. Input voltage V is typically a DC input that sweeps the frequency. At the low-end frequency, V=$V_{ss}$ and at high-end frequency, V=$V_{dd}$. V can range between, for example, 0 and 1.3 V DC or between 0 and 5 V DC.

In this embodiment, matched devices 150 include capacitors 152 and 155 having a capacitance value C. Capacitor 152 is coupled between output 123 of amplifier 120 and inverting input 132 of amplifier 130. The inverting input 132 is commonly coupled with VCR 145 as well as non-inverting inputs 121 and 111 of amplifiers 120 and 110, respectively. Capacitor 155 is coupled between output 133 of amplifier 130 and inverting input 122 of amplifier 120. The inverting input 122 is commonly coupled with VCR 142 as well as non-inverting input 131 and inverting input 112 of amplifiers 130 and 110, respectively.

For initialization purposes, switches 160 and 170 are coupled to the VCO 100 at outputs 123 and 133 of amplifiers 120 and 130, respectively. In accordance with embodiments of the present invention, VCOs can be operated such that an initial output starts off with a positive amplitude such as a positive half of a square wave (i.e., initialize "high"). Alternatively, VCOs can be operated such that an initial output starts off with a negative amplitude such as a negative half of a square wave (i.e., initialize "low"). To initialize a "high" causing a positive initialization cycle, switch 160 sets output 123 to supply voltage $V_{ss}$ and switch 170 sets output 133 to supply $V_{dd}$ when enable signal is de-asserted (i.e., when enable signal is set to 0 when using asserted-high logic or when enable signal is set to 1 when using asserted-low logic). Alternatively, to initialize a "low" causing a negative initialization cycle, switch 170 sets output 123 to $V_{dd}$ and switch 170 sets output 133 to $V_{ss}$ when enable signal is de-asserted. It is recognized that the enable signal should be de-asserted long enough to set the initialization cycle proportional to V. V sets the operating frequency and is independent of switches 160 and 170 and the initialization process.

Advantageously, in accordance with embodiments of the present invention, when enable signal is de-asserted, the enable signal can be used to disable the differential amplifiers, thus eliminating static power consumption. When enable signal is asserted (i.e., when enable signal is set to 1 for asserted high logic or when enable signal is set to 0 for asserted low logic), the switches 160 and 170 have no effect on the rest of the circuitry as the VCO oscillates. Typically, supply voltage $V_{ss}$ is coupled to a ground potential and thus is at a lower potential than supply voltage $V_{dd}$. It is recognized that any suitable switch circuitry can be used for initialization switches 160 and 170. Switches 160 and 170 can be operated in other embodiments of the present invention in the manner similar to the one described above. In alternative embodiments of the present invention, another signal and/or switching circuitry can be used to select the initialization state as an initial "high" or "low," thus a versatile VCO can be advantageously achieved.

In operation, when $V_+$>V−, a negative differential input at amplifier 130 causes a voltage drop across VCR 145. As a result, a current I flows across VCR 145 and into the output 133 of differential amplifier 130. This flow of current I discharges capacitor 152 connected to $V_+$. Simultaneously, a positive differential input at amplifier 120 causes a drop across VCR 142. As a result, a current I flows out of output 123 of amplifier 120 and across VCR 142 charging capacitor 155. Capacitor 155 charges while capacitor 152 simultaneously discharges causing V− to increase and $V_+$ to decrease at the same rate until the condition V−>$V_+$ is reached.

When the condition V−>$V_+$ is reached and propagated through the feedback paths, a positive differential-input at amplifier 130 causes a voltage drop across VCR 145. As a result, a current I flows out of output 133 of amplifier 130 and across VCR 145 charging capacitor 152 (previously discharged). Simultaneously, a negative differential input at amplifier 120 causes a drop across VCR 142. As a result, a current I flows into the output 123 of amplifier 120 and across VCR 142, discharging capacitor 155. Capacitor 152 charges while capacitor 155 simultaneously discharges causing V− to decrease and $V_+$ to increase at the same rate until the condition $V_+$>V− is reached. After the condition $V_+$>V− is reached and propagated though the feedback paths, the circuits have returned to the initial state to complete one cycle. The completion of one cycle as described above relates to one oscillation at output $V_{out}$ 113 of amplifier 110 and ultimately the oscillator 100. The term cycle as used herein refers to a completion of one oscillation of, for example, a square wave signal having a positive half and a negative half.

This cycling process continues, resulting in an output Vout 113 that oscillates at or close to a 50% duty cycle due to component level symmetry in the circuitry between nodes 118 and 119.

In embodiments of the present invention, the output frequency (f) at output $V_{out}$ 113 is inversely proportional to the time constant RC (where R is the value of matched VCRs 142 and 145, and C is the value of matched capacitors 152 and 155). The value R of the VCRs and C of the capacitors provide both negative and positive feedback to the amplifiers 120 and 130. The feedback is determined by the R and C values.

Positive feedback to the amplifiers is provided through the matched capacitors 152, 155, while negative feedback to the amplifiers is provided through the VCRs. In embodiments of the present invention, the positive feedback occurs during the first half of a half cycle and the negative feedback becomes more dominant in the last half of a half cycle. Embodiments of the present invention rely on both positive and negative feedback for a stable oscillating output.

Figure 2:
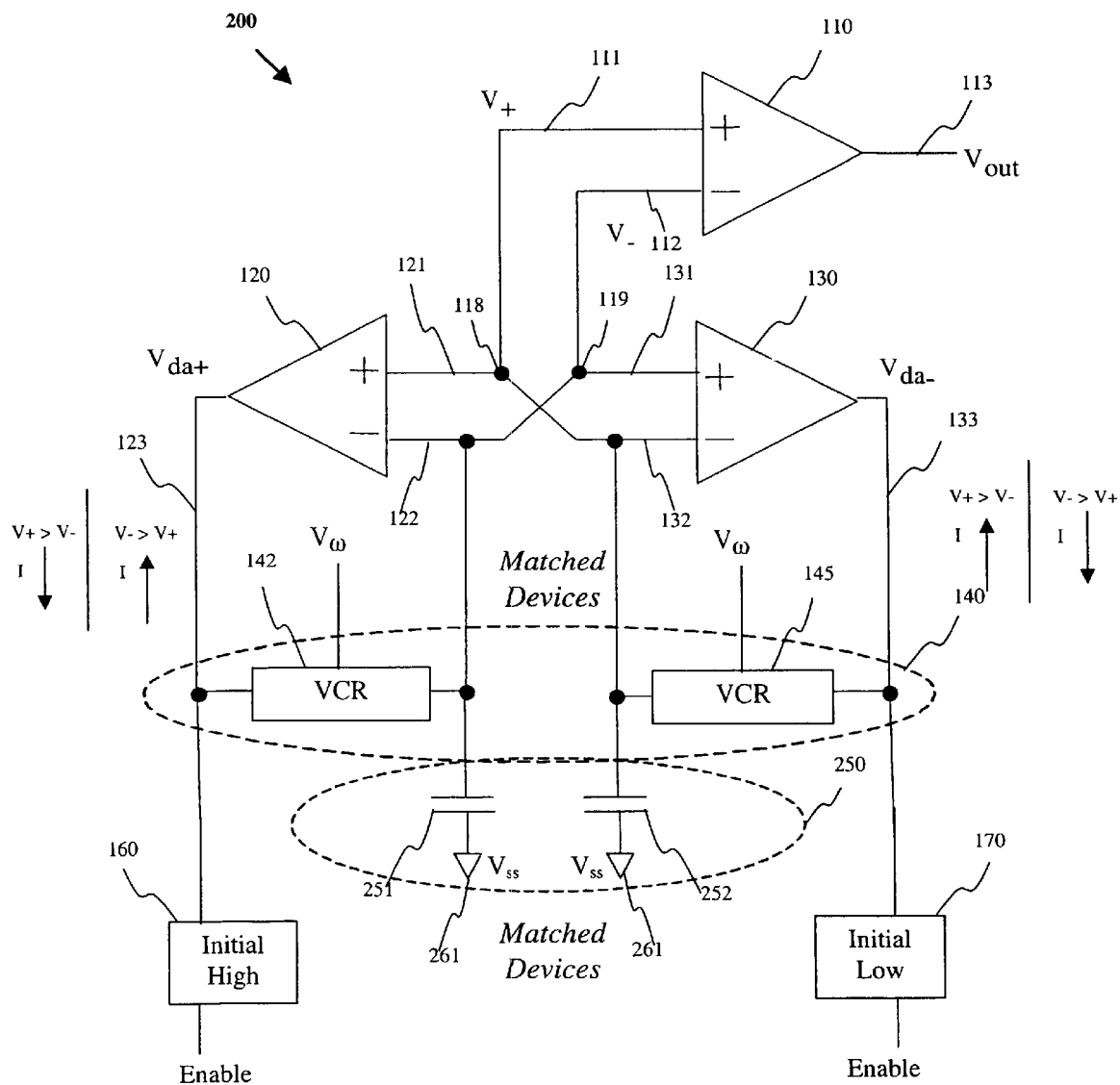
FIG. 2 is a circuit diagram of a VCO according to an alternative embodiment of the present invention.

FIG. 2 shows a circuit diagram of a VCO 200 according to an alternative embodiment of the present invention. VCO 200 includes symmetrical circuitry coupled to and/or between inputs 111 and 112 of amplifier 110 at nodes 118 and 119, respectively. VCO 200 is similar to VCO 100 except that matched devices 250 includes capacitors 251 and 252 that are coupled to ground (which is typically $V_{ss}$) instead of being coupled to amplifier outputs as shown in FIG. 1. Capacitor 251 is coupled to inverting input 122 of amplifier 120 and ground node 261. Capacitor 252 is coupled to inverting input 132 of amplifier 130 and ground node 261. It can be seen that capacitor 251 is further connected to VCR 142 and inverting input 112 of amplifier 110, and that capacitor 252 is further connected to VCR 145 and non-inverting input 111 of amplifier 110. Initialization switches 160 and 170 are coupled to VCR's 142 and 145, respectively and operate in the manner described above with respect to FIG. 1.

In operation, VCO 200 is similar to VCO 100 in that when $V_+>V-$, current I flows into the output 133 of differential amplifier 130. This flow of current I discharges capacitor 252. Simultaneously, a current I flows out of output 123 of amplifier 120 charging capacitor 251. Capacitor 252 is discharged while capacitor 251 is charged, increasing V− and decreasing $V_+$, until $V->V_+$. When $V->V_+$, currents I will flow in opposite directions at the amplifier outputs 123 and 133, respectively. This opposite flow of current I charges capacitor 252 and discharges capacitor 251 until initial condition $V_+>V-$ is reached to complete one cycle. As indicated above, the completion of one cycle relates to one oscillation at output $V_{out}$ 113 of amplifier 110 and ultimately the oscillator 100.

This cycling process continues, resulting in an output $V_{out}$ 113 that oscillates at or close to a 50% duty cycle due to component level symmetry in the circuitry between nodes 118 and 119.

Figure 3:
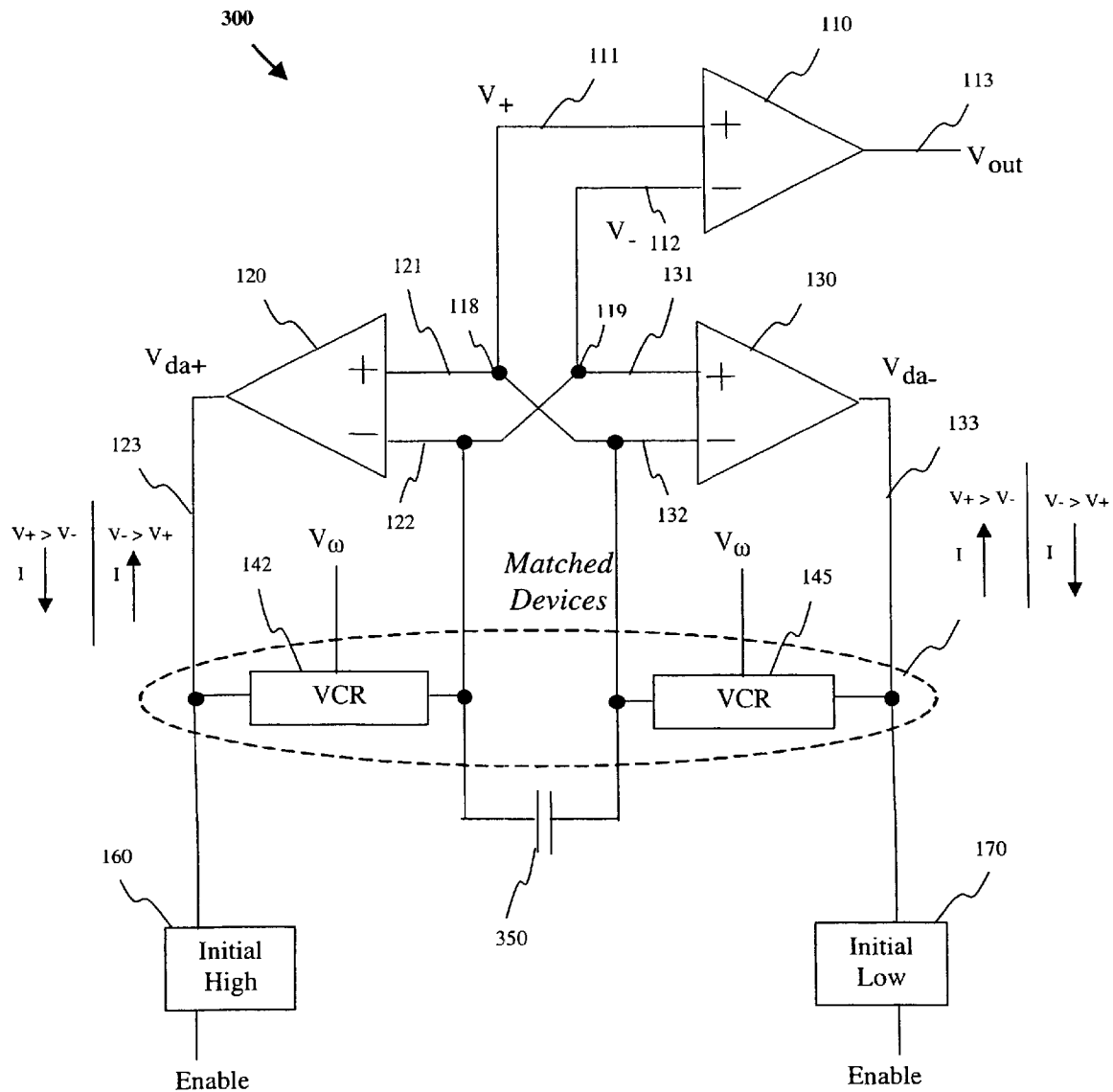
FIG. 3 is a circuit diagram of a VCO according to another alternative embodiment of the present invention.

FIG. 3 shows a circuit diagram of a VCO 300 according to another alternative embodiment of the present invention. VCO 300 also includes symmetrical circuitry coupled to inputs 111 and 112 of amplifier 110 at nodes 118 and 119, respectively. In this embodiment, as ingle capacitor 350 is advantageously coupled between VCRs 142, 145 and inverting inputs 122, 132 of amplifiers 120, 130, respectively. Accordingly, circuit symmetry is maintained with respect to the inputs 111, 112 of amplifier 110. In operation, the single capacitor 350 is charged and discharged resulting in an output $V_{out}$ 113 that oscillates at or close to a 50% duty cycle due to component level symmetry in the circuitry between nodes 118 and 119.

Figure 4:
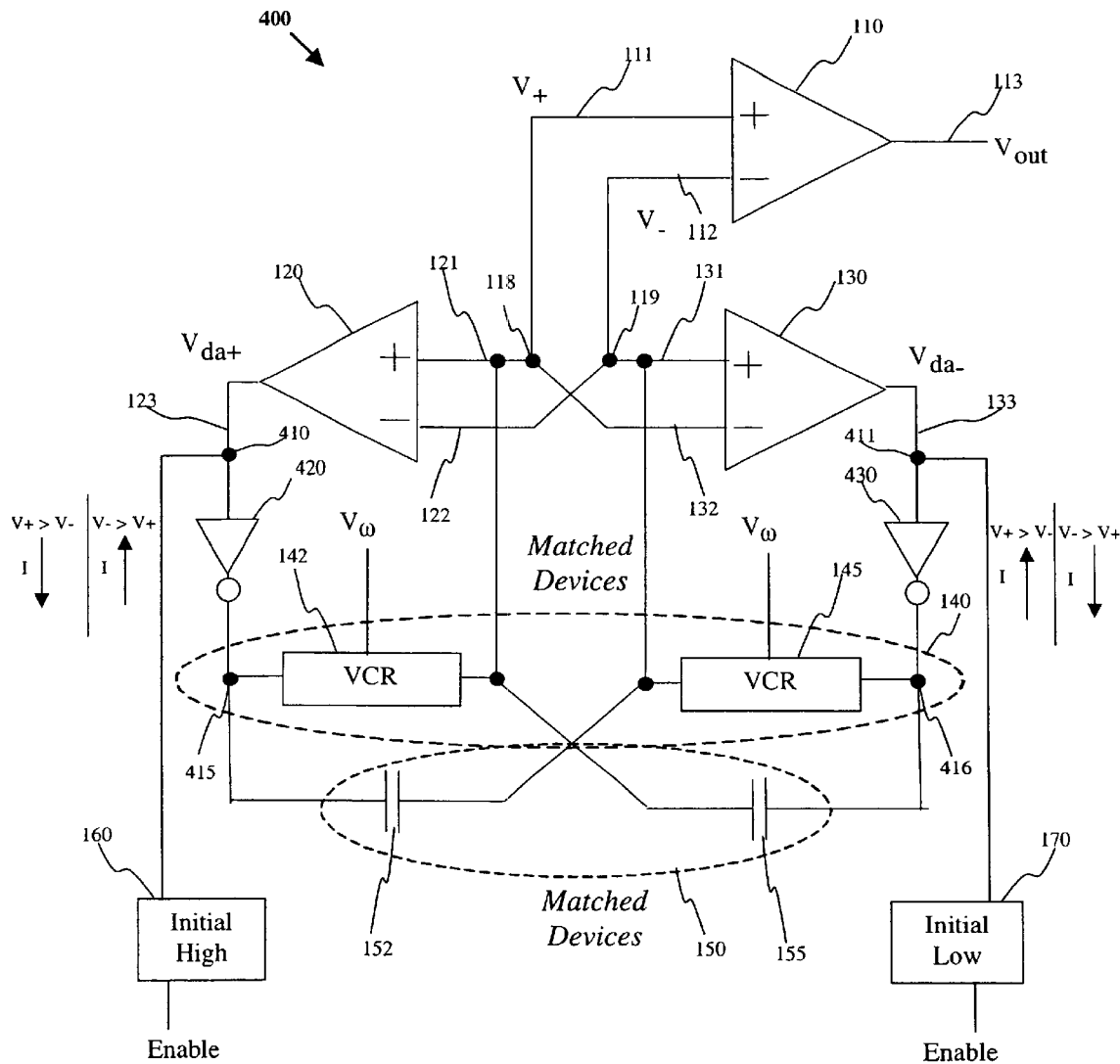
FIG. 4 is a circuit diagram of a VCO according to another alternative embodiment of the present invention.

FIG. 4 shows a circuit diagram of a VCO 400 according to another alternative embodiment of the present invention. As shown in FIG. 4, VCO 400 circuit includes inverter 420 coupled between nodes 410 and 415 of output 123 of amplifier 120, and inverter 430 coupled between nodes 411 and 416 of output 133 of amplifier 130. In the case where, for example, amplifiers 110, 120 and 130 are differential amplifiers, inverters 420, 430 can offer increased gain at the outputs of amplifiers 120 and 130 while adding minimal delay to the feedback paths. This causes wider voltage swings at the outputs 415 and 416, allowing the RC time constant to more dominantly determine the output frequency. This is advantageous in that higher gains can be achieved without utilizing operational amplifiers that can introduce additional stages resulting in reduced operational speeds of the VCO. The operation of VCO 400 is similar to the operation of VCOs shown in FIGS. 1–3 and described above. As shown in FIG. 4, component level symmetry is maintained with respect to the inputs 111, 112 of amplifier 110 resulting in a VCO 400 that oscillates at or close to a 50% duty cycle.

In an alternative embodiment of the present invention, a VCO having the advantages of the present invention can be achieved by eliminating differential amplifier 110 from the embodiments shown in FIGS. 1–4. If equal loading is applied to lines 111 and 112, a further simplified VCO that oscillates at or close to a 50% duty cycle but has less gain than the VCOs of FIGS. 1–4 can be achieved. In this case, line 111 behaves as the non-inverting output of the simplified VCO and line 112 behaves as the inverting output of the simplified VCO. One of the outputs can be used as a input while the other output can be coupled to, for example, a dummy load having the same loading characteristics as the input. An example of an input can include a clock input to another circuit.

Figure 5:
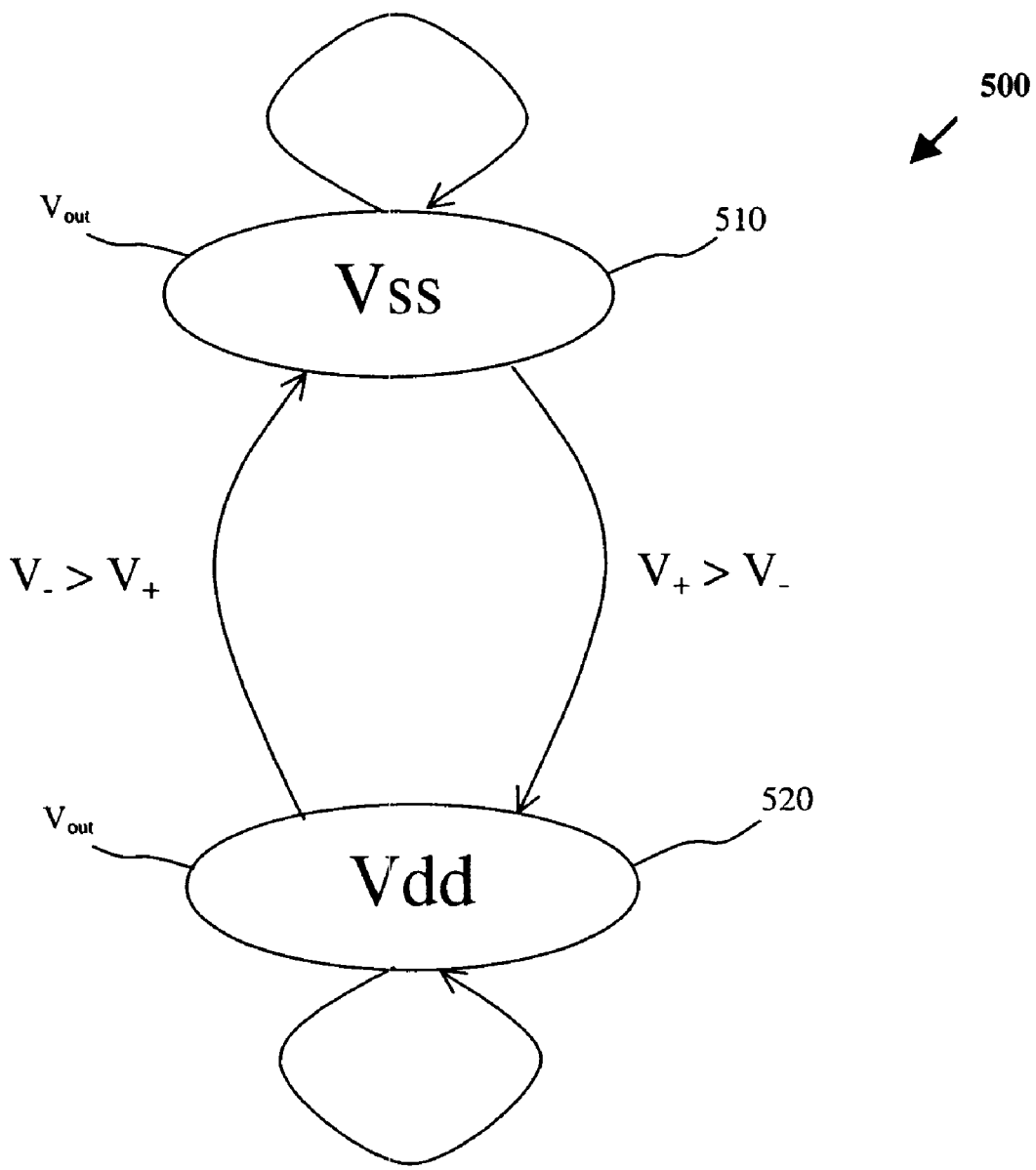
FIG. 5 is a state diagram illustrating output characteristics of a VCO in accordance with embodiments of the present invention.

FIG. 5 is a state diagram 500 illustrating the various states of the circuits shown in FIGS. 1–4. When input $V_+$ (i.e., non-inverting input 111)<input V− (i.e., inverting input 112), $V_+$ approaches $V_{dd}$ and V− approaches $V_{ss}$. In this case, the output $V_{out}$ 113 can reach a minimum peak of $V_{ss}$ (510). Then, when $V_+>V-$ is achieved, $V_+$ continues to increase and V− continues to decrease while the new polarity propagates through the feedback paths, then current directions reverse to cause $V_+$ to approach $V_{ss}$ and V− to approach $V_{dd}$. In this state, the output $V_{out}$ 113 can reach a maximum peak of $V_{dd}$ (520). Then, when $V->V_+$ is achieved, $V_+$ continues to decrease and V− continues to increase while the new polarity propagates through the feedback paths, then current directions reverse to cause $V_+$ to approach $V_{dd}$ and V− to approach $V_{ss}$ again, completing one cycle.

Figure 6:
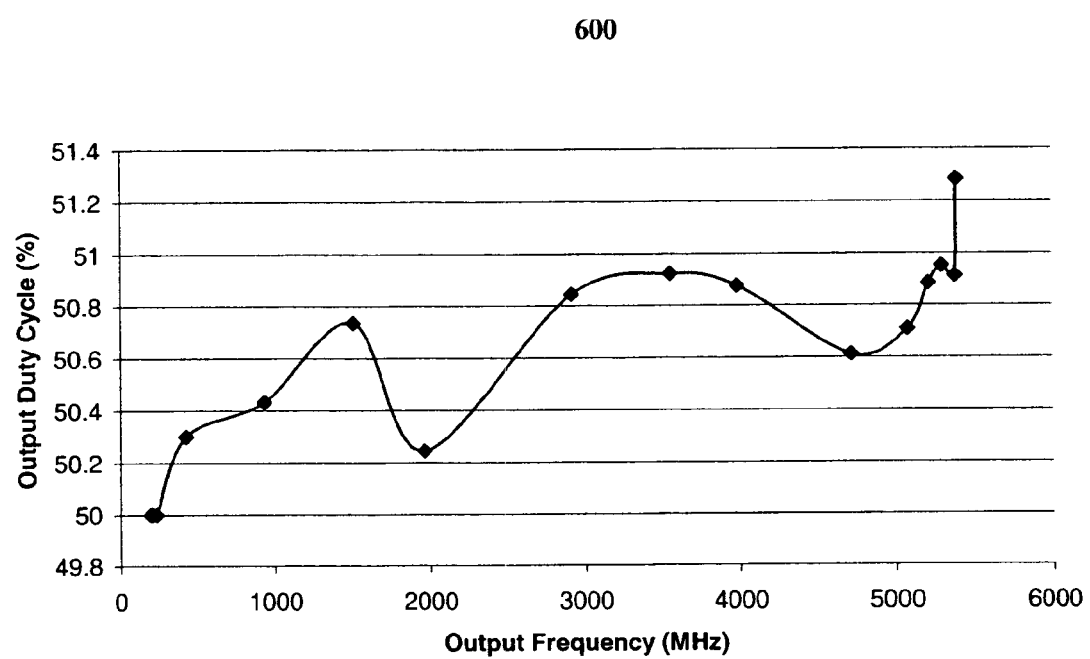
FIG. 6 is a graph showing the output characteristics of a VCO in accordance with embodiments of the present invention.

FIG. 6 is a graph showing the output characteristics of a VCO designed in accordance with embodiments of the present invention. The graph 600 shows Output Duty Cycle (%) over a wide range of Output Frequencies (MHz). As shown in FIG. 6, at the low-end frequencies, for example, 300 MHz to 2 Ghz output duty cycle is maintained at or close to a 50% level. At higher frequency ranges, for example, 4–6 Ghz, output duty cycle is maintained fairly close to a 50% level. As shown, in accordance with embodiments of the present invention, the output duty cycle is maintained at an optimal level across a wide frequency range extending to very high frequencies. Unlike traditional VCOs, the VCO of the present invention can achieve optimal performance across a wide frequency range without operating at twice the desired frequency. Thus, reducing the amount of power that is wasted.

In accordance with embodiments of the present invention, using matched devices and symmetrical circuitry, a VCO can achieve optimal performance across a wide frequency range. By maintaining a duty cycle as close to 50% as possible at the output of a VCO a more accurate and efficient VCO can be achieved.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed:

1. A voltage controlled oscillator comprising:
   symmetrical circuitry;
   a non-inverting output coupled to the symmetrical circuitry; and
   an inverting output coupled to symmetrical circuitry, the symmetrical circuitry being configured to produce an oscillating output at the non-inverting and inverting outputs, wherein the symmetrical circuitry includes a first symmetrical half having a first differential amplifier and a first voltage controlled resistor, and a second symmetrical half having a second differential amplifier and a second voltage controlled resistor.

2. The voltage controlled oscillator of claim 1, wherein the first voltage controlled resistor and the second voltage controlled resistor are matched devices and the first capacitor and second capacitor are matched devices.

3. The voltage controlled oscillator of claim 1, wherein a non-inverting input of the first differential amplifier is commonly coupled to a first capacitor, the second voltage controlled resistor and the non-inverting output.

4. The voltage controlled oscillator of claim 3, wherein an output of the first differential amplifier is commonly coupled to the first voltage controlled resistor and the first capacitor.

5. The voltage controlled oscillator of claim 3, wherein an inverting input of the second differential amplifier is commonly coupled to the non-inverting input of the first differential amplifier.

6. The voltage controlled oscillator of claim 1, further comprising:
a third differential amplifier, wherein a non-inverting input of the third differential amplifier is coupled to the non-inverting output and the inverting input of the third differential amplifier is coupled to the inverting output.

7. The voltage controlled oscillator of claim 1, wherein a non-inverting input of the second differential amplifier is commonly coupled to the first voltage controlled resistor, a second capacitor and the inverting output.

8. The voltage controlled oscillator of claim 7, wherein an output of the second differential amplifier is commonly coupled to the second voltage controlled resistor and the second capacitor.

9. The voltage controlled oscillator of claim 7, wherein an inverting input of the first differential amplifier is commonly coupled to the non-inverting input of the second differential amplifier.

10. The voltage controlled oscillator of claim 1, wherein a non-inverting input of the first differential amplifier is commonly coupled to the second voltage controlled resistor, a second capacitor and the non-inverting output.

11. The voltage controlled oscillator of claim 10, wherein an output of the first differential amplifier is coupled to the first voltage controlled resistor.

12. The voltage controlled oscillator of claim 10, wherein the second capacitor is further coupled to ground.

13. The voltage controlled oscillator of claim 1, wherein a non-inverting input of the second differential amplifier is commonly coupled to the first voltage controlled resistor, the first capacitor and the inverting output.

14. The voltage controlled oscillator of claim 13, wherein an output of the second differential amplifier is coupled to the second voltage controlled resistor.

15. The voltage controlled oscillator of claim 13, wherein the first capacitor is further coupled to ground.

16. The voltage controlled oscillator of claim 1, wherein the first voltage controlled resistor and the second voltage controlled resistor are matched devices, and the voltage controlled oscillator further comprising:
a capacitor coupled between the first symmetrical half and the second symmetrical half.

17. The voltage controlled oscillator of claim 16, wherein a non-inverting input of the first differential amplifier is commonly coupled to the second voltage controlled resistor, the capacitor and the non-inverting output.

18. The voltage controlled oscillator of claim 16, wherein a non-inverting input of the second differential amplifier is commonly coupled to the first voltage controlled resistor, the capacitor and the inverting output.

19. The voltage controlled oscillator of claim 1, wherein the symmetrical circuitry further comprising:
a first inverter coupled between an output of the first differential amplifier and the first voltage controlled resistor; and a second inverter coupled between an output of the second differential amplifier and the second voltage controlled resistor.

20. A voltage controlled oscillator, comprising:
an output differential amplifier;
symmetrical circuitry coupled between each of a non-inverting input and inverting input of the output differential amplifier, the symmetrical circuitry including a first input differential amplifier having one of its inputs commonly coupled to one of the inputs of the output amplifier, a first capacitor and a first voltage controlled resistor; and
a second input differential amplifier having one of its inputs commonly coupled to one of the other inputs of the output amplifier, a second capacitor matched to the first capacitor and a second voltage controlled resistor matched to the first voltage controlled resistor.

21. The voltage controlled oscillator of claim 20, wherein an inverting input of the first input amplifier is coupled to a non-inverting input of the second input amplifier.

22. The voltage controlled oscillator of claim 21, wherein an inverting input of the second input amplifier is coupled to a non-inverting input of the first input amplifier.

23. A voltage controlled oscillator comprising:
a first circuit including a first differential amplifier and a first voltage controlled resistor; and
a second circuit including a second differential amplifier and a second voltage controlled resistor, the first and second circuits being symmetrical to each other and coupled to a non-inverting output and an inverting output, and the first and second circuits are configured to produce an oscillating output at the non-inverting and inverting outputs.

24. The voltage controlled oscillator of claim 23, wherein the first voltage controlled resistor and the second voltage controlled resistor are matched devices.

25. The voltage controlled oscillator of claim 23, further comprising:
a capacitor coupled to at least one of the non-inverting outputs and inverting outputs.

26. The voltage controlled oscillator of claim 23, further comprising:
a third differential amplifier, wherein a non-inverting input of the third differential amplifier is coupled to the non-inverting output and the inverting input of the third differential amplifier is coupled to the inverting output.

27. The voltage controlled oscillator of claim 1, wherein the first symmetrical half further includes a first capacitor.

28. The voltage controlled oscillator of claim 1, wherein the second symmetrical half further includes a second capacitor.

* * * * *